US012661877B2

(12) United States Patent
Inoue et al.

(10) Patent No.: US 12,661,877 B2
(45) Date of Patent: Jun. 23, 2026

(54) MEMBER SUPPLYING SHEET

(71) Applicant: NITTO DENKO CORPORATION, Osaka (JP)

(72) Inventors: Takeo Inoue, Osaka (JP); Eisaku Tanaka, Osaka (JP); Bunta Hirai, Osaka (JP); Tomohiro Kontani, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 384 days.

(21) Appl. No.: 18/284,401

(22) PCT Filed: Mar. 25, 2022

(86) PCT No.: PCT/JP2022/014709
§ 371 (c)(1),
(2) Date: Sep. 27, 2023

(87) PCT Pub. No.: WO2022/210435
PCT Pub. Date: Oct. 6, 2022

(65) Prior Publication Data
US 2024/0173947 A1     May 30, 2024

(30) Foreign Application Priority Data
Apr. 1, 2021     (JP) ................................. 2021-062854

(51) Int. Cl.
B32B 27/08 (2006.01)
B32B 5/18 (2006.01)
(Continued)

(52) U.S. Cl.
CPC ................ B32B 27/08 (2013.01); B32B 5/18 (2013.01); B32B 7/12 (2013.01); B32B 27/065 (2013.01);
(Continued)

(58) Field of Classification Search
CPC .... B32B 27/08; B32B 27/322; H01L 21/6836
See application file for complete search history.

(56) References Cited

U.S. PATENT DOCUMENTS

2005/0074606 A1     4/2005   Nishiyama et al.
2011/0291300 A1     12/2011  Hirano et al.
(Continued)

FOREIGN PATENT DOCUMENTS

JP     2003-313516     11/2003
JP     2005-105212     4/2005
(Continued)

OTHER PUBLICATIONS

International Search Report issued in International Patent Application No. PCT/JP2022/014709, dated May 31, 2022.
(Continued)

*Primary Examiner* — Zachary M Davis
(74) *Attorney, Agent, or Firm* — GREENBLUM & BERNSTEIN, P.L.C.

(57)     ABSTRACT

A member supplying sheet includes two or more protective cover members each configured to be placed on a face of an object that has an opening on the face; and a substrate sheet with the two or more protective cover members arranged on a surface thereof. The protective cover members each include a laminate including: a protective membrane shaped to cover the opening when the protective cover member is placed on the face; and a carrier film. The substrate sheet includes a substrate layer and an adhesive layer laminated on the substrate layer. The carrier film is adhered to the substrate layer via the adhesive layer. The surface free energy of the carrier film on a surface thereof on the side closer to the substrate sheet is 20 mJ/m² or more. The adhesive layer has a tack force of 100 mN/mm² or less.

9 Claims, 10 Drawing Sheets

(51) Int. Cl.

| | |
|---|---|
| *B32B 7/12* | (2006.01) |
| *B32B 27/06* | (2006.01) |
| *B32B 27/28* | (2006.01) |
| *B32B 27/30* | (2006.01) |
| *B32B 27/32* | (2006.01) |
| *H10P 72/70* | (2026.01) |

(52) U.S. Cl.

CPC .......... *B32B 27/281* (2013.01); *B32B 27/286* (2013.01); *B32B 27/304* (2013.01); *B32B 27/308* (2013.01); *B32B 27/322* (2013.01); *H10P 72/7402* (2026.01); *B32B 2266/025* (2013.01); *B32B 2307/306* (2013.01); *B32B 2307/724* (2013.01); *B32B 2307/748* (2013.01); *B32B 2457/00* (2013.01)

(56) References Cited

U.S. PATENT DOCUMENTS

| | | | |
|---|---|---|---|
| 2013/0026648 A1 | 1/2013 | Hirano et al. | |
| 2017/0006369 A1* | 1/2017 | Kenaley | B32B 5/02 |
| 2018/0009655 A1* | 1/2018 | Holliday | B32B 27/288 |
| 2018/0016471 A1 | 1/2018 | Kamochi et al. | |
| 2019/0198378 A1* | 6/2019 | Goto | C09J 7/29 |
| 2022/0266575 A1 | 8/2022 | Abe et al. | |

FOREIGN PATENT DOCUMENTS

| | | |
|---|---|---|
| JP | 2007-194303 | 8/2007 |
| JP | 2008-303386 | 12/2008 |
| JP | 2017-92461 | 5/2017 |
| JP | 2018-501972 | 1/2018 |
| TW | 201636204 | 10/2016 |
| WO | 2011/089664 | 7/2011 |
| WO | 2016/100265 | 6/2016 |
| WO | 2021/010197 | 1/2021 |

OTHER PUBLICATIONS

Written Opinion issued in International Patent Application No. PCT/JP2022/014709, dated May 31, 2022.

Japan, Notice of Reasons for Refusal refusal received in JP Application No. 2021-062854, dated Oct. 29, 2024.

* cited by examiner

MEMBER SUPPLYING SHEET

TECHNICAL FIELD

The present invention relates to a member supplying sheet for supplying protective cover members each configured to be placed on a face of an object that has an opening on the face.

BACKGROUND ART

In recent years, there is a demand for placement of a protective cover member over an opening of a micro-product such as a microelectromechanical system (herein-after referred to as "MEMS"). As one approach to meet this demand, in order to improve the efficiency of placing a protective cover member in a production step of such a product, picking up the protective cover member utilizing an apparatus that picks up semiconductor devices by pushing them up has been considered. Such an apparatus may be configured to pick up a protective cover member 62 by a suction nozzle 57 or the like in the state where a substrate sheet 61 is pushed up by a push-up indenter 64 (at this time, the protective cover member 62 partially peels off from the substrate sheet 61) from the side opposite to an arrangement surface 63 of the substrate sheet 61 on which the protective cover member 62 is arranged (see FIG. 1).

Patent Literature 1 discloses a vent assembly for protect-ing an opening of a MEMS. The vent assembly includes an ePTFE membrane vent (ventilation filter) and a carrier attached to the ventilation filter using an adhesive, and also, a liner (substrate sheet), which is a UV curable dicing tape, is adhered to the lower face of the carrier. The protective cover member for an opening of a MEMS as disclosed in Patent Literature 1 is typically supplied to an end user in the form of a member sheet that will be divided to serve as protective cover members and to which a substrate sheet is adhered. The member sheet is divided into a plurality of protective cover members by dicing, or in other words, singulation, performed by the end user. After the dicing, the protective cover members are irradiated with ultraviolet light (UV light) in order to facilitate partial peeling of the protective cover members from the substrate sheet.

CITATION LIST

Patent Literature

Patent Document 1: JP 2018-501972 A

SUMMARY OF INVENTION

Technical Problem

According to the studies by the inventors of the present invention, in a method for supplying the members disclosed in Patent Literature 1, over a long period of time during storage or the like after a substrate sheet 91 is adhered to a member sheet 93 using an adhesive 92 (see the drawing on the left in FIG. 2), the adhesive 92 of the substrate sheet 91 becomes more and more closely fitted to a lower part of the member sheet 93 (see the drawing on the right in FIG. 2). The inventors also found that the adhesive force of the adhesive of the substrate sheet increases as a result of the above-described closer fitting achieved over time, and this leads to instability of the pick-up performance at the time of picking up the protective cover members from the substrate sheet using the above-described pick-up apparatus.

The present invention aims to provide an improved mem-ber supplying sheet for supplying protective cover members.

Solution to Problem

The present invention provides a member supplying sheet for supplying protective cover members, including:
- two or more protective cover members each configured to be placed on a face of an object that has an opening on the face; and
- a substrate sheet with the two or more protective cover members arranged on a surface thereof, wherein
- the protective cover members each include a laminate including: a protective membrane shaped to cover the opening when the protective cover member is placed on the face; and a carrier film joined to a peripheral portion of the protective membrane,
- the substrate sheet includes a substrate layer and an adhesive layer laminated on the substrate layer,
- the carrier film is adhered to the substrate layer via the adhesive layer,
- a surface free energy of the carrier film on a surface thereof on a side closer to the substrate sheet is 20 $mJ/m^2$ or more, and
- the adhesive layer has a tack force of 100 $mN/mm^2$ or less.

Advantageous Effects of Invention

In the member supplying sheet of the present invention, the surface free energy of the carrier film of the protective cover member is equal to or more than a predetermined value on the surface of the carrier film on the side closer to the substrate sheet. Further, the tack force of the adhesive layer of the substrate sheet is equal to or less than a predetermined value. According to the studies by the inven-tors, this member supplying sheet is configured such that the tack force of the adhesive layer is suppressed. This allows smooth and reliable proceeding of the above-described partial peeling of the protective cover member at the time of push-up and final peeling of the protective cover member at the time of subsequent pick-up. Therefore, the member supplying sheet of the present invention improves the pick-up performance.

DESCRIPTION OF EMBODIMENTS

Embodiments of the present invention will be described with reference to the drawings. It is to be noted that the present invention is not limited to the following embodiments.

Figure 1:
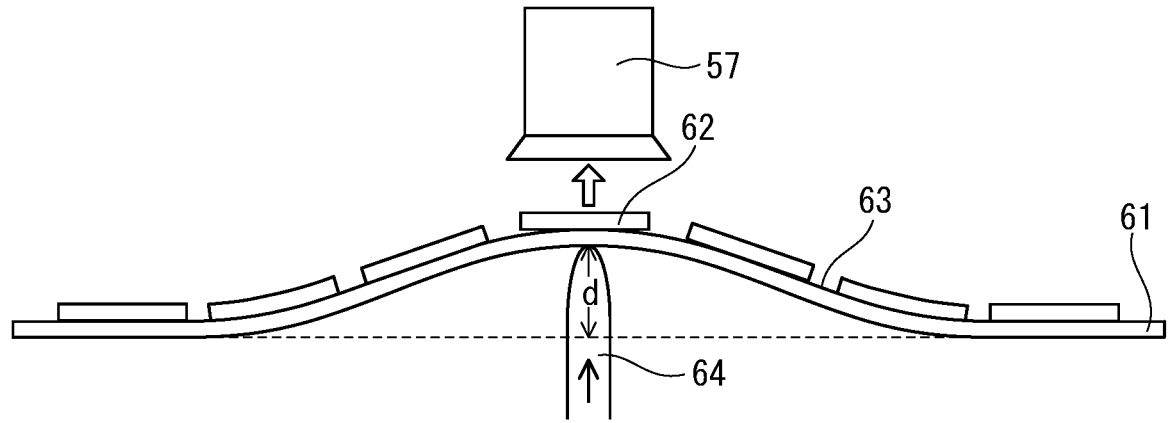
FIG. 1 schematically illustrates how a push-up pick-up apparatus picks up a protective cover member.
Figure 2:
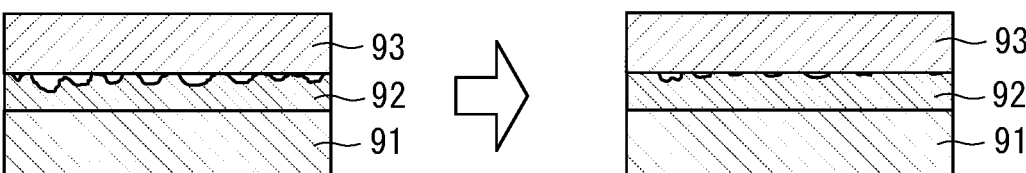
FIG. 2 schematically illustrates, regarding the member disclosed in Patent Literature 1, the mechanism by which the adhesive force of the adhesive of the substrate sheet increases over time.
Figure 3A:
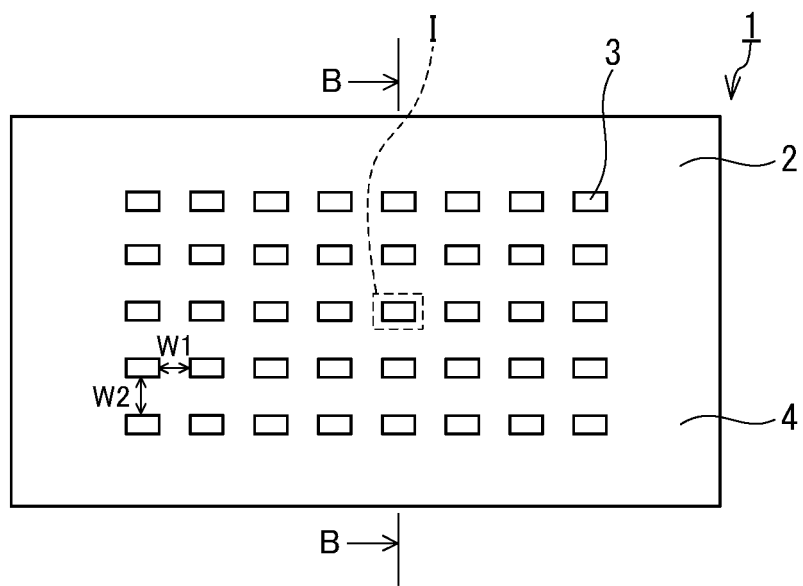
FIG. 3A is a plan view schematically showing an example of the member supplying sheet of the present invention.
Figure 3B:
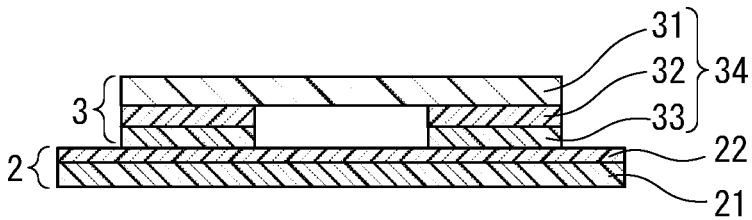
FIG. 3B is a cross-sectional view showing a cross-section B-B of a region I of the member supplying sheet shown in FIG. 3A.

An example of the member supplying sheet of the present invention is shown in FIGS. 3A and 3B. FIG. 3B shows a cross-section B-B of a region I of a member supplying sheet 1 shown in FIG. 3A. The member supplying sheet 1 includes a substrate sheet 2 and two or more protective cover members 3 arranged on a surface (arrangement surface) 4 of the substrate sheet 2. As described above, in the member supplying sheet 1, the plurality of protective cover members 3 are arranged in an array on the surface 4 of the substrate sheet 2.

The protective cover members 3 are arranged in rows and columns on the surface 4 of the substrate sheet 2 with intervals W between the protective cover members 3. The intervals W may be 0.05 mm or more and 5.0 mm or less, and in particular, may be 0.10 mm or more and 3.0 mm or less. The intervals W may be larger than the width of a dicing saw. In other words, the intervals W may be 0.10 mm or more, or may be even 3.0 mm or more. The substrate sheet 2 in FIG. 3A is in the form of a sheet having a rectangular shape. On the surface 4 of the substrate sheet 2, the protective cover members 3 that are rectangular when viewed perpendicular to the surface 4 are arranged in an array. The intervals W encompass an interval W1 along the longitudinal direction of the protective cover members 3 and an interval W2 along the transverse direction of the protective cover members 3 when viewed perpendicular to the principal surfaces of the protective cover members 3. The interval W1 and the interval W2 may each fall within the ranges exemplified above for the intervals W. The interval W1 and the interval W2 may be the same or different from each other.

The member supplying sheet 1 is a sheet for supplying the protective cover members 3. The protective cover member 3 is a member to be placed on a face (placement face) of an object that has an opening on the face. By placing the protective cover member 3 on the placement face, it is possible to prevent, for example, entry of foreign matter into and/or from the opening, i.e., entry of foreign matter through the opening. The protective cover member 3 may be a member to be placed on a face of an object that has an opening on the face to prevent the entry of foreign matter into the opening. The protective cover member 3 includes a laminate 34 including a protective membrane 31 and a carrier film 33 joined to a peripheral portion of the protective membrane 31. The protective membrane 31 is shaped to cover the opening when the protective cover member 3 is placed on the face.

In the example shown in FIG. 3B, the laminate 34 has a three-layer structure including the protective membrane 31, an adhesive layer 32, and the carrier film 33. The protective membrane 31 and the adhesive layer 32 are joined to each other. The adhesive layer 32 and the carrier film 33 are joined to each other. The substrate sheet 2 includes a substrate layer 21 and an adhesive layer 22 laminated on the substrate layer 21. In the member supplying sheet 1, the carrier film 33 is adhered to the substrate layer 21 via the adhesive layer 22.

The laminate 34 may have a two-layer structure including the protective membrane 31 and the carrier film 33. In this case, the protective membrane 31 and the carrier film 33 may be welded together using a technique such as ultrasonic welding.

In the protective cover member 3, the surface free energy of the carrier film 33 on the surface thereof on the side closer to the substrate sheet 2 is 20 mJ/m$^2$ or more. The surface free energy of the carrier film 33 on the surface thereof on the side closer to the substrate sheet 2 may be 30 mJ/m$^2$ or more, 40 mJ/m$^2$ or more, or even 50 mJ/m$^2$ or more. The upper limit of the surface free energy of the carrier film 33 is, for example, 65 mJ/m$^2$ or less.

The surface free energy of a solid (i.e., surface tension) is calculated as follows.

The surface tension $\gamma$ is represented by: Surface tension $\gamma$=Dispersive energy component $\gamma^d$+Polar energy component $\gamma^p$. In the following, the surface tension $\gamma$ of a liquid is denoted as $\gamma_L$, and the surface tension $\gamma$ of a solid is denoted as $\gamma_S$. Regarding two types of liquids L (pure water and ethylene glycol) whose surface tensions $\gamma$ are known, $\gamma_L$, $\gamma_L{}^d$, and $\gamma_L{}^p$ are obtained with reference to literatures and the like. These known values of the two types of liquids L are shown in Table 1 below.

TABLE 1

| Liquids L | $\gamma_L$ (mN/m) | $\gamma_L{}^d$ (mN/m) | $\gamma_L{}^P$ (mN/m) |
|---|---|---|---|
| Pure water | 72.8 | 21.8 | 51.0 |
| Ethylene glycol | 47.7 | 29.4 | 18.3 |

The contact angles θ of the two types of liquids L (pure water and ethylene glycol) are measured using an automatic contact angle measuring system (EKO Instruments Co., Ltd., Contact Angle System OCA30).

Figure 15:
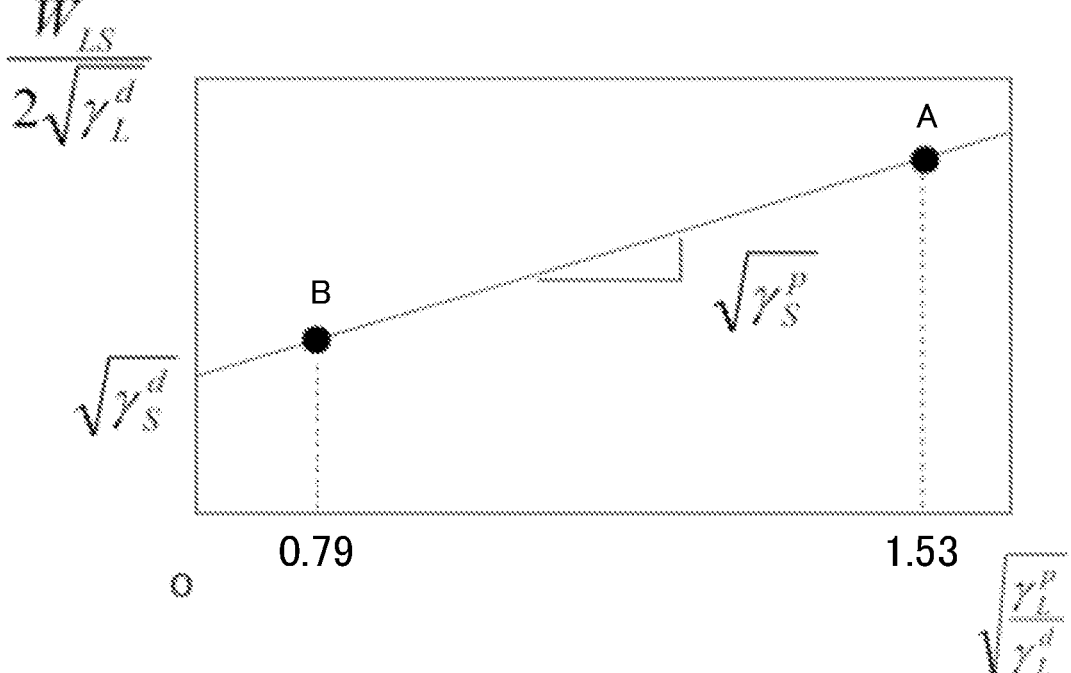
FIG. 15 is a graph used to calculate the surface free energy of each member supplying sheet in Examples.

Using the Young-Dupre equation shown below and the values shown in Table 1 and the measured contact angles θ of the two types of liquids L, the graph shown in FIG. is obtained. In the graph of FIG. 15, the point A indicates pure water and the point B indicates ethylene glycol. In the following, $W_{LS}$ corresponds to the left side of the Young-Dupre equation.

$$\gamma_L(1 + \cos\theta) = 2\sqrt{\gamma_L^d\gamma_S^d} + 2\sqrt{\gamma_L^P\gamma_S^P}$$

$\downarrow$

Divide both sides of the equation by $2\sqrt{\gamma_L^d}$ $$\underbrace{\frac{W_{LS}}{2\sqrt{\gamma_L^d}}}_{Y} = \sqrt{\gamma_S^d} + \sqrt{\gamma_S^P}\underbrace{\sqrt{\frac{\gamma_L^P}{\gamma_L^d}}}_{X}$$

From the graph shown in FIG. 15, the intercept $(\gamma_S^d)^{0.5}$ and the slope $(\gamma_S^P)^{0.5}$ are calculated. The surface tension $\gamma_S$ of a solid is represented by: Dispersive energy component $\gamma_S^d$+Polar energy component $\gamma_S^P$. Thus, the surface free energy can be calculated from the results of the above calculation.

In the substrate sheet 2, the adhesive layer 22 has a tack force of 100 mN/mm$^2$ or less. The tack force of the adhesive layer 22 may be 90 mN/mm$^2$ or less or may be even 85 mN/mm$^2$ or less. The lower limit of the tack force of the adhesive layer 22 is, for example, 20 mN/mm$^2$ or more.

Figure 16:
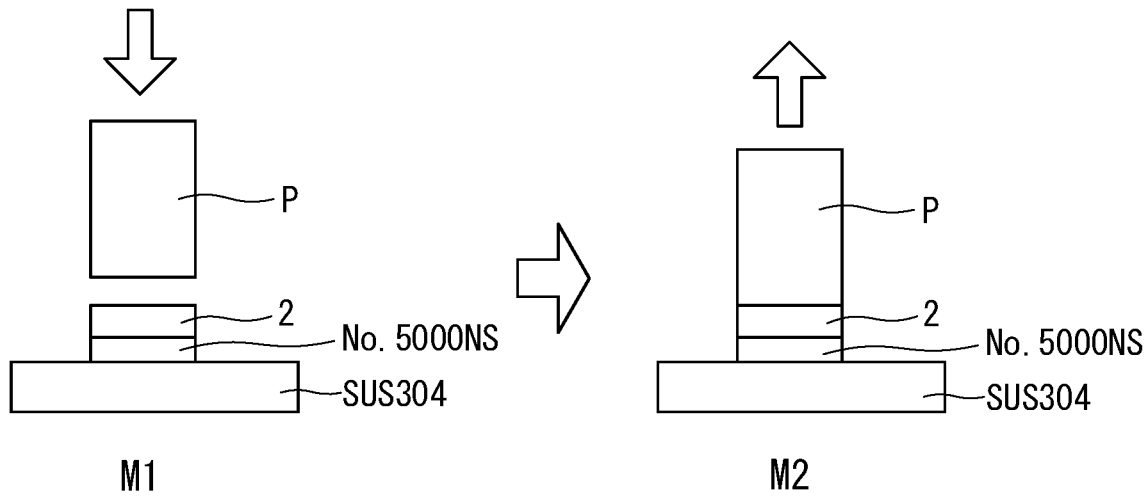
FIG. 16 schematically illustrates an evaluation test performed in Examples to evaluate the tack force of each member supplying sheet.

A tensile test for determining the tack force will be described with reference to FIG. 16. The substrate sheet 2 is adhered to one surface of an acrylic double-sided tape (Nitto Denko Corporation, No. 5000NS) such that the adhesive layer 22 of the substrate sheet 2 is on the outer side (the upper side in FIG. 16), and thereafter, the resulting laminate is cut into a square piece of 15 mm×15 mm. The other surface of No. 5000NS is adhered to a base made of SUS304. A cylindrical probe P made of SUS304 and having a diameter of 10 mm is set in a tensile tester (Shimadzu Corporation, Autograph AGS-X). The test piece is subjected to compression bonding at 25° C. and at a rate of 3 mm/min under conditions of 5N×15 seconds (compression mode M1). Thereafter, a tensile test is performed at 25° C. and at a rate of 100 mm/min (tensile mode M2). The tack force can be calculated by measuring the maximum load at this time.

The member supplying sheet 1 can be used as a sheet for supplying the protective cover members 3 to a push-up pick-up apparatus. It should be noted that the supply destination of the protective cover members 3 using the member supplying sheet 1 is not limited to a push-up pick-up apparatus. For example, the protective cover members 3 can also be supplied to any types of pick-up apparatuses other than a push-up pick-up apparatus, or alternatively, may be supplied to a step in which the protective cover members 3 are used after being picked up, e.g., by hand or with tweezers. Examples of the push-up pick-up apparatus include a chip mounter and a die bonder. It should be noted that the push-up pick-up apparatus is not limited to the above examples.

Figure 4:
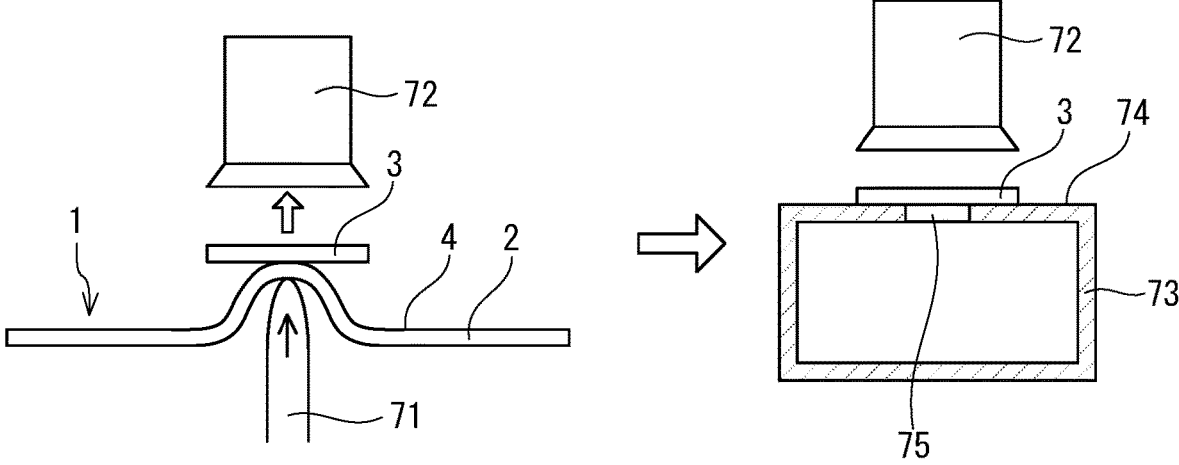
FIG. 4 schematically illustrates an embodiment of how a protective cover member is supplied using the member supplying sheet of the present invention.

FIG. 4 illustrates an example of how the protective cover member 3 is supplied using the member supplying sheet 1 to a push-up pick-up apparatus. As shown in FIG. 4, in the member supplying sheet 1 supplied to the push-up pick-up apparatus, a position at which a protective cover member 3 is arranged is pushed up by a push-up indenter 71 of the apparatus from the side opposite to the surface 4 of the substrate sheet 2. As a result of the push-up, the substrate sheet 2 deforms upward, whereby the protective cover member 3 partially peels off from the substrate sheet 2. The surface that has peeled off is located between the carrier film 33 of the protective cover member 3 and the adhesive layer 22 of the substrate sheet 2. In this state, the protective cover member 3 is picked up from the substrate sheet 2 by a pick-up section 72 such as a suction nozzle. The protective cover member 3 thus picked up can be, for example, conveyed by the pick-up section 72 and placed on a face 74 of an object 73 that has an opening 75 on the face 74. The protective cover member 3 can be placed such that, for example, the carrier film 33 is in contact with the face 74.

Figure 5A:
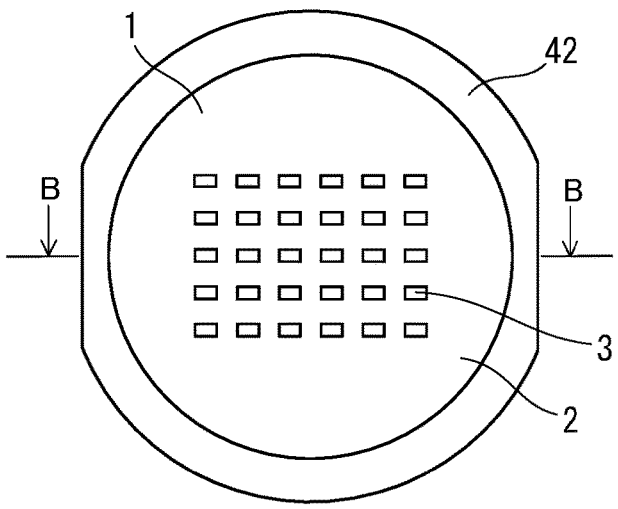
FIG. 5A is a schematic plan view illustrating an embodi-ment of how a protective cover member is supplied using the member supplying sheet of the present invention.
Figure 5B:
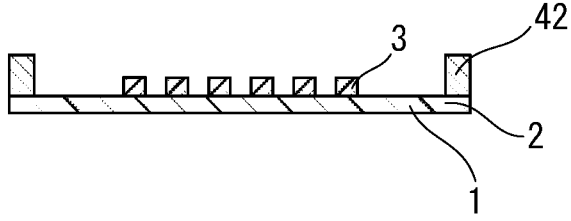
FIG. 5B is a cross-sectional view schematically showing a cross-section B-B taken from FIG. 5A.
Figure 5C:
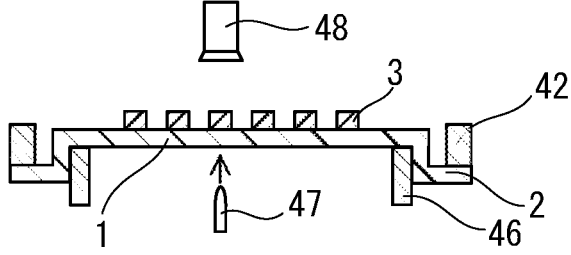
FIG. 5C is a cross-sectional view schematically illustrating the state at the time of pick-up.

A specific embodiment of pick-up is not limited as long as the substrate sheet 2 is pushed up at the time of the pick-up. FIGS. 5A to 5C illustrates an example of the specific embodiment of pick-up. FIG. 5B shows a cross-section B-B taken from FIG. 5A. FIG. 5C schematically illustrates the state at the time of pick-up. The member supplying sheet 1 shown in FIGS. 5A and 5B is supplied to a push-up pick-up apparatus in the state of being fixed to a dicing ring (wafer ring) 42. The member supplying sheet 1 in FIGS. 5A and 5B is fixed to the dicing ring 42 with the adhesive layer 22 of the substrate sheet 2. It should be noted that the method for fixing the member supplying sheet 1 is not limited to the above example. For example, the member supplying sheet 1 may be fixed to the dicing ring 42 using, for example, a double-sided adhesive tape.

In the example shown in FIG. 5A, two or more protective cover members 3 are regularly arranged on the substrate sheet 2. More specifically, the protective cover members 3 are arranged such that, when viewed perpendicular to the surface of the substrate sheet 2, the centers of the respective protective cover members 3 are at the intersections (lattice points) of rectangular lattices. It should be noted that the regular arrangement of the protective cover members 3 is not limited to the above example. The protective cover members 3 may be regularly arranged such that the centers of the respective protective cover members 3 are at the intersections of any of various types of lattices, such as square lattices, orthorhombic lattices, or rhombic lattices. Also, the embodiment of the arrangement of the protective cover members 3 is not limited to the above examples. For example, the protective cover members 3 may be arranged in a staggered pattern when viewed perpendicular to the surface of the substrate sheet 2. The center of the protective cover member 3 can be defined as the center of gravity of the shape of the member 3 when viewed perpendicular to the surface thereof.

In the example illustrated in FIG. 5C, the substrate sheet 2 is pushed up in the state where the member supplying sheet 1 is lifted up by another dicing ring (expanding ring) 46 whose outer diameter is smaller than the inner diameter of the dicing ring 42. The protective cover member 3 is picked up from the substrate sheet 2 by a suction nozzle 48 at a moment when the amount of push-up by the push-up indenter 47 reaches its maximum.

The material forming the substrate layer 21 included in the substrate sheet 2 is typically a resin. Examples of the resin include: polyolefins such as polyethylene and polypropylene; polyvinyl chloride; and polyurethane. It should be noted that the material forming the substrate layer 21 is not limited to the above examples. The substrate layer 21 may be a single layer, or may have a laminate structure including two or more layers.

The adhesive layer 22 laminated on the substrate layer 21 is an ultraviolet curable adhesive (UV curable adhesive) that has been cured by ultraviolet light (UV light) irradiation. In other words, the adhesive layer 22 is formed by curing the UV curable adhesive laminated on the substrate layer 21 by UV light irradiation. When the adhesive layer 22 is a UV curable adhesive that has been cured by UV light irradiation, an increase in tack force over time is suppressed. As a result, the pick-up performance for picking up the protective cover members 3 is improved.

The substrate sheet 2 may be a dicing tape with a laminate structure including the substrate layer 21 and the adhesive layer 22.

The thickness of the substrate sheet 2 is, for example, 1 to 200 μm. The thickness of the substrate sheet 2 may be 100 μm or less.

The substrate sheet 2 shown in FIG. 3A is in the form of a sheet having a rectangular shape. The substrate sheet 2 shown in FIG. 5A is in the form of a sheet having a circular shape. The shape of the substrate sheet 2 in the form of a sheet is not limited to the above examples, and may be a polygon such as a square or rectangle, a circle, or an oval. When the substrate sheet 2 is in the form of a sheet, the member supplying sheet 1 can be distributed and used in the form of a single sheet. The substrate sheet 2 may be in the form of a strip, and in this case, the member supplying sheet 1 is also in the form of a strip. The member supplying sheet 1 in the form of a strip can be distributed in the form of a roll obtained by winding the member supplying sheet 1 around a core.

The protective membrane 31 may be air impermeable in its thickness direction, or may be air permeable in the thickness direction. When the protective membrane 31 has air permeability in the thickness direction, placement of the protective cover member 3 allows, for example, passage of air through the opening 75 of the object 73 while preventing entry of foreign matter through the opening 75. By allowing the passage of air, it becomes possible to achieve, for example, adjustment of pressure and alleviation of pressure fluctuations through the opening 75 of the object 73. An example of an approach to alleviate pressure fluctuations will be described below. There is a case where a heat treatment such as reflow soldering is performed in the state where a semiconductor device is placed so as to cover one of the openings of a through hole provided in a circuit board. In this case, by placing the protective cover member 3 so as to cover the other opening of the through hole, it is possible to prevent the entry of foreign matter into the semiconductor device through the through hole during the heat treatment. When the protective membrane 31 has air permeability in the thickness direction, pressure rise in the through hole caused by the heating is alleviated, whereby damage to the semiconductor device caused by the pressure rise can be prevented. Examples of the semiconductor device include MEMSs such as microphones, pressure sensors, and acceleration sensors. These devices have an opening through which air or sound can pass, and can be placed on a circuit board such that the opening faces the above-described through hole. The protective cover member 3 may be placed on a completed semiconductor device so as to cover an opening 75 of the semiconductor device. When the protective membrane 31 has air permeability in the thickness direction, the protective cover member 3 after being placed can function as, for example, an air-permeable member that allows passage of air through the opening 75 while preventing entry of foreign matter through the opening 75 and/or a sound-permeable member that allows passage of sound through the opening 75 while preventing entry of foreign matter through the opening 75. It should be noted that, even when the protective membrane 31 is air impermeable in the thickness direction, the protective cover member 3 after being placed still can function as a sound-permeable member because it is possible to transmit sound utilizing vibration of the protective membrane 31.

The protective membrane 31 having air permeability in the thickness direction has an air permeability of, for example, 100 sec/100 mL or less, as expressed in terms of air permeance (Gurley air permeability) determined according to the air permeability measurement method B (Gurley method) specified in JIS L1096.

The protective membrane 31 may be waterproof and/or dustproof. The protective cover member 3 including the waterproof protective membrane 31 can function as, for example, a waterproof air-permeable member and/or a waterproof sound-permeable member after being placed on the object 73. The water pressure resistance of the waterproof protective membrane 31 is, for example, 5 kPa or more, which is a value determined according to the water resistance test method A (low water pressure method) or water resistance test method B (high water pressure method) specified in JIS L1092.

Examples of the material forming the protective membrane 31 include metals, resins, and composite materials thereof.

Examples of the resins that can form the protective membrane 31 include polyolefins such as polyethylene and polypropylene, polyesters such as polyethylene terephthalate (PET), silicone resins, polycarbonates, polyimides, polyamide-imides, polyphenylene sulfide, polyetheretherketone (PEEK), and fluorine resins. Examples of the fluorine resins include polytetrafluoroethylene (PTFE), tetrafluoroethylene-perfluoroalkyl vinyl ether copolymers (PFA), tetrafluoroethylene-hexafluoropropylene copolymers (FEP), and tetrafluoroethylene-ethylene copolymers (ETFE). It should be noted that the resins are not limited to the above examples.

Examples of the metals that can form the protective membrane 31 include stainless steel and aluminum.

The protective membrane 31 may be formed of a heat-resistant material. In this case, depending on the materials of the other layers of the protective cover member 3, the protective cover member 3 can play its role more reliably for treatments under high temperature conditions, such as reflow soldering. Examples of the heat-resistant material include metals and heat-resistant resins. The heat-resistant resin typically has a melting point of 150° C. or higher. The heat-resistant resin may have a melting point of 160° C. or higher, 200° C. or higher, 250° C. or higher, 260° C. or higher, or even 300° C. or higher. Examples of the heat-resistant resin include silicone resins, polyimides, polyamide-imides, polyphenylene sulfide, PEEK, and fluorine resins. PTFE may be used as the fluorine resin. PTFE has particularly good heat resistance.

The protective membrane 31 having air permeability in the thickness direction may include a stretched porous membrane. The stretched porous membrane may be a stretched porous membrane formed of a fluorine resin, and in particular, may be a stretched porous PTFE membrane. The stretched porous PTFE membrane is usually formed by stretching a cast membrane or a paste extrusion containing PTFE particles. The stretched porous PTFE membrane is formed of fine PTFE fibrils, and may have nodes in which PTFE is more highly aggregated than in the fibrils. The stretched porous PTFE membrane can achieve both a high level of performance in preventing entry of foreign matter and a high degree of air permeability. A known stretched porous membrane can be used as the protective membrane 31.

The protective membrane 31 having air permeability in the thickness direction may include a perforated membrane in which a plurality of through holes connecting both principal surfaces of the membrane are formed. The perforated membrane may be a membrane obtained by forming a plurality of through holes in an original membrane having a non-porous matrix structure, e.g., a non-porous membrane. The perforated membrane need not have any other ventilation path extending in the thickness direction than the above-described through holes. Each through hole may extend in the thickness direction of the perforated membrane, and may be a straight hole extending linearly in the thickness direction. The openings of the through hole may have a circular or oval shape when viewed perpendicular to the principal surfaces of the perforated membrane. The perforated membrane can be formed, for example, by laser processing of the original membrane or by ion beam irradiation of the original membrane and subsequent chemical etching to perforate the membrane.

The protective membrane 31 having air permeability in the thickness direction may include a non-woven fabric, a woven fabric, a mesh, or a net.

The protective membrane 31 is not limited to the above examples.

The protective membrane 31 shown in FIG. 3B has a rectangular shape when viewed perpendicular to the principal surface thereof. It should be noted that the shape of the protective membrane 31 is not limited to the above example, and may be, for example, a polygon such as a square or rectangle, a circle, or an oval when viewed perpendicular to the principal surface thereof. The polygon may be a regular polygon. The polygon may have a rounded corner(s).

The thickness of the protective membrane 31 is, for example, 1 to 100 μm.

The area of the protective membrane 31 is, for example, 175 mm² or less. The protective cover member 3 including the protective membrane 31 having an area falling within the above range is suitable for placement on, for example, a circuit board or MEMS, which typically has an opening with a small diameter. The lower limit of the area of the protective membrane 31 is, for example, 0.20 mm² or more. The protective membrane 31 may have a larger area depending on the type of an object on which the protective cover member 3 is to be placed.

The adhesive layer 32 is, for example, a layer formed by applying an adhesive. Examples of the adhesive include acrylic adhesives, silicone adhesives, urethane adhesives, epoxy adhesives, and rubber adhesives. When use of the protective cover member 3 under high temperature conditions should be taken into account, it is preferable to select an acrylic adhesive or a silicone adhesive, which are both highly heat resistant, and it is particularly preferable to select an acrylic adhesive.

Examples of the acrylic adhesives include adhesives disclosed in JP 2005-105212 A. Examples of the silicone adhesives include adhesives (including those disclosed as Comparative Examples) disclosed in JP 2003-313516 A.

The adhesive layer 32 may be a single layer, or may have a laminate structure including two or more adhesive layers.

The adhesive layer 32 shown in FIG. 3B is joined to the protective membrane 31. It should be noted that an additional layer(s) may be present between the protective membrane 31 and the adhesive layer 32.

Figure 6:
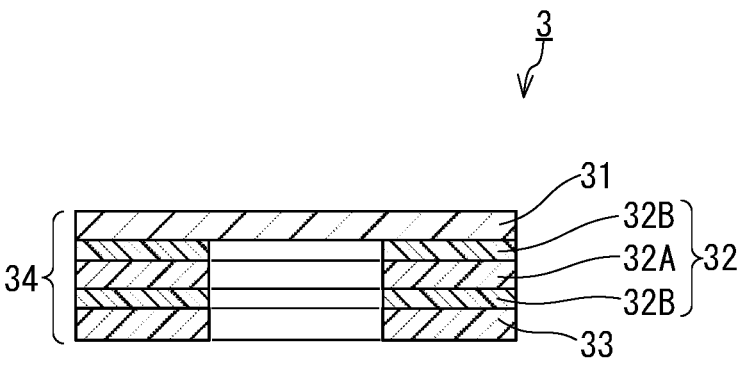
FIG. 6 is a cross-sectional view schematically showing an example of a protective cover member supplied using the member supplying sheet of the present invention.

The adhesive layer 32 may be a double-sided adhesive tape (see FIG. 6). The adhesive layer 32 shown in FIG. 6 is a substrate-including tape including a substrate 32A and adhesive layers 32B provided on both surfaces of the substrate 32A. The adhesives included in the pair of adhesive layers 32B may be the same or different from each other. For example, one of the adhesive layers 32B may include an acrylic adhesive and the other adhesive layer 32B may include a silicone adhesive. The double-sided adhesive tape may be a substrate-free tape that does not includes the substrate 32A.

Figure 7A:
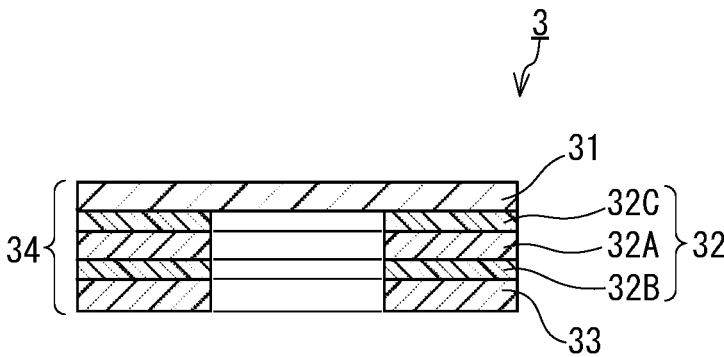
FIG. 7A is a cross-sectional view schematically showing an example of a protective cover member supplied using the member supplying sheet of the present invention.
Figure 7B:
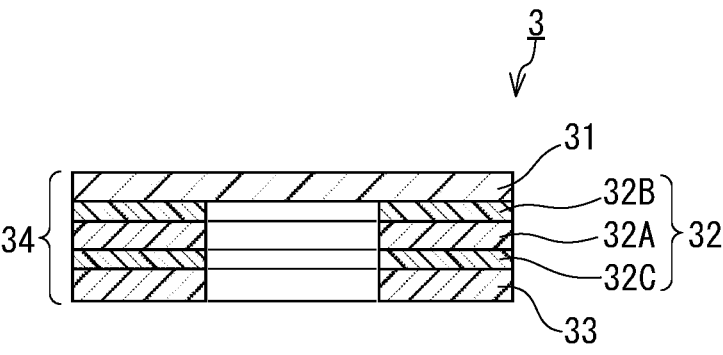
FIG. 7B is a cross-sectional view schematically showing an example of a protective cover member supplied using the member supplying sheet of the present invention.

The adhesive layer 32 may be a combination of a plurality of adhesive layers. The adhesive layer 32 may be a laminate structure made up of the combination of: a single-sided adhesive tape including a substrate 32A and an adhesive layer 32B provided on one surface of the substrate 32A; and an adhesive layer 32C (see FIGS. 7A and 7B). In the example shown in FIG. 7A, the adhesive layer 32B of the single-sided adhesive tape serves as a joining surface joined to the surface of the carrier film 33. In the example shown in FIG. 7B, the adhesive layer 32C serves as a joining surface joined to the surface of the carrier film 33. The adhesive layer 32C may be a layer formed by applying an adhesive, or may be a double-sided adhesive tape.

The joining surface of the adhesive layer 32 joined to the surface of the carrier film 33 is preferably formed of an acrylic adhesive.

The substrate 32A of the adhesive tape is, for example, a film, a non-woven fabric, or a foam, each made of a resin, a metal, or a composite material thereof. The substrate 32A of the adhesive tape may be formed of a heat-resistant material. In this case, depending on the materials of the other layers of the protective cover member 3, the protective cover member 3 can play its role more reliably when used under high temperature conditions. Specific examples of the heat-resistant material are as described above in connection with the protective membrane 31.

The thickness of the adhesive layer 32 is, for example, 10 to 200 μm.

The carrier film 33 is a non-adhesive film. The carrier film 33 is, for example, a resin film, a non-woven fabric, a paper sheet, a metal foil, a woven fabric, a rubber sheet, a foamed sheet, or a laminate thereof. The resin film may contain, for example, at least one selected from the group consisting of polyimides (PIs), polyvinylidene fluoride (PVdF), polyethersulfone (PES), and polyphenylene sulfide (PPS).

The carrier film 33 shown in FIG. 3B is joined to the adhesive layer 32. It should be noted that an additional layer(s) may be present between the carrier film 33 and the adhesive layer 32.

The thickness of the carrier film 33 is, for example, 10 to 200 μm.

Figure 8:
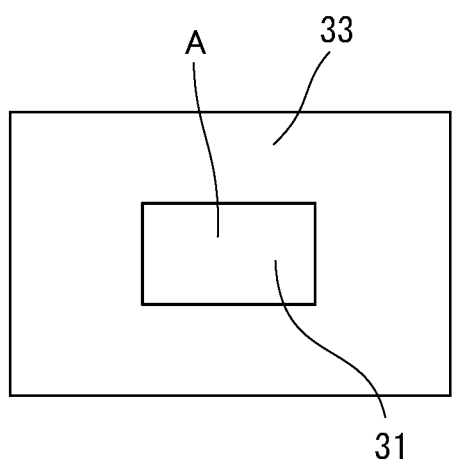
FIG. 8 is a plan view schematically showing an example of a protective cover member supplied using the member supplying sheet of the present invention.

The adhesive layer 32 and the carrier film 33 shown in FIG. 3B are present in a limited region on the principal surface of the protective membrane 31, when viewed perpendicular to the principal surface of the protective membrane 31. The adhesive layer 32 and the carrier film 33 shown in FIG. 3B are in the shape of a peripheral portion of the protective membrane 31, more specifically, in a picture frame-like shape, when viewed perpendicular to the principal surface of the protective membrane 31 (see FIG. 8). FIG. 8 is a plan view of the protective cover member 3 shown in FIGS. 3A and 3B as viewed from the carrier film 33 side. This structure allows more favorable passage of air and/or sound in a region A of the protective membrane 31 where the adhesive layer 32 and the carrier film 33 are not present than in a region where the adhesive layer 32 and the carrier film 33 are present. It should be noted that the shape of the adhesive layer 32 and the shape of the carrier film 33 are not limited to the above example.

The area of the region A of the protective membrane 31 is, for example, 20 mm$^2$ or less. The protective cover member 3 including the region A having an area falling within the above range is suitable for placement on, for example, a circuit board or MEMS, which typically has an opening with a small diameter. The lower limit of the area of the region A is, for example, 0.008 mm$^2$ or more. The region A may have a larger area depending on the type of the object 73 on which the protective cover member 3 is to be placed.

The laminate 34 constituting the protective cover member 3 may further include a layer(s) other than the protective membrane 31, the adhesive layer 32, and the carrier film 33. FIGS. 9 to 12 show examples of the protective cover member 3 including an additional layer(s).

Figure 9:
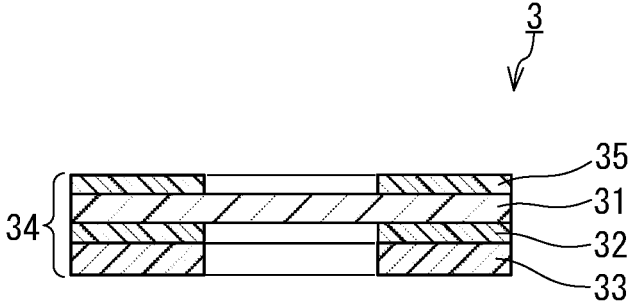
FIG. 9 is a cross-sectional view schematically showing an example of a protective cover member supplied using the member supplying sheet of the present invention.

The laminate 34 shown in FIG. 9 includes an adhesive layer 35 positioned such that the protective membrane 31 is sandwiched between the adhesive layer 35 and the adhesive layer 32. In this case, an additional layer can be further placed on the adhesive layer 35, and also, the adhesive layer 35 can be joined to, for example, any member and/or surface at the time of placing the protective cover member 3 on the object 73. The protective cover member 3 may be placed such that, instead of the adhesive layer 32, the adhesive layer 35 is in contact with the face 74 of the object 73. The adhesive layer 35 shown in FIG. 9 is joined to the protective membrane 31. It is to be noted that an additional layer(s) may be present between the protective membrane 31 and the adhesive layer 35. The protective cover member 3 shown in FIG. 9 is the same as the protective cover member 3 shown in FIG. 3B, except that it further includes the adhesive layer 35.

The adhesive layer 35 may have the same structure as the adhesive layer 32. For example, the adhesive layer 35 may be a double-sided adhesive tape (see FIG. 10). The adhesive layer 35 in FIG. 10 is a substrate-including tape including a substrate 35A and adhesive layers 35B provided on both surfaces of the substrate 35A.

Figure 10:
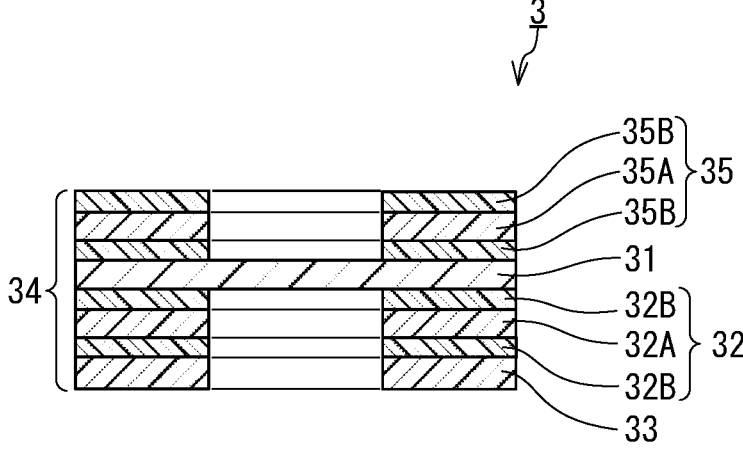
FIG. 10 is a cross-sectional view schematically showing an example of a protective cover member supplied using the member supplying sheet of the present invention.

The adhesive layer 35 shown in each of FIGS. 9 and 10 has the same shape as the adhesive layer 32. This allows more favorable passage of air and/or sound in a region B of the protective membrane 31 where the adhesive layer 35 is not present than in a region where the adhesive layer 35 is present. It should be noted that the shape of the adhesive layer 35 is not limited to the above example. The numerical range of the area of the region B may be the same as that of the area of the region A. The area of the region B may be equal to the area of the region A.

Figure 11:
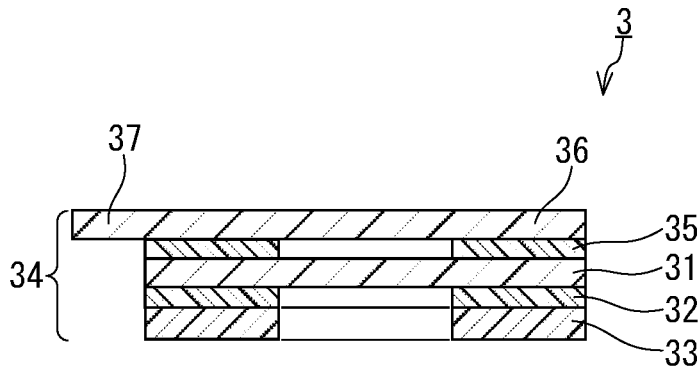
FIG. 11 is a cross-sectional view schematically showing an example of a protective cover member supplied using the member supplying sheet of the present invention.

The laminate 34 shown in FIG. 11 further includes a cover film 36 that is positioned on the side opposite to the adhesive layer 32 and the carrier film 33 with respect to the protective membrane 31 and covers the protective membrane 31. The cover film 36 is arranged on the adhesive layer 35. An additional layer(s) may be further present between the adhesive layer 35 and the cover film 36. The cover film 36 functions as a protective film for protecting the protective membrane 31 until, for example, the protective cover member 3 is placed on the object 73. The cover film 36 may be peeled off after the protective cover member 3 is placed on the object 73. The cover film 36 may cover the protective membrane 31 either partially or entirely when viewed perpendicular to the principal surface of the protective membrane 31.

The cover film 36 shown in FIG. 11 has a tab 37, which is a portion protruding outward beyond the outer periphery of the protective membrane 31, when viewed perpendicular to the principal surface of the protective membrane 31. The tab 37 can be used for peeling off the cover film 36. It should be noted that the shape of the cover film 36 is not limited to the above example.

Examples of the material forming the cover film 36 include metals, resins, and composite materials thereof. Specific examples of the material that can form the cover film 36 are the same as those given above as the specific examples of the material that can form the substrate 32A.

The thickness of the cover film 36 is, for example, 200 to 1000 μm.

Figure 12:
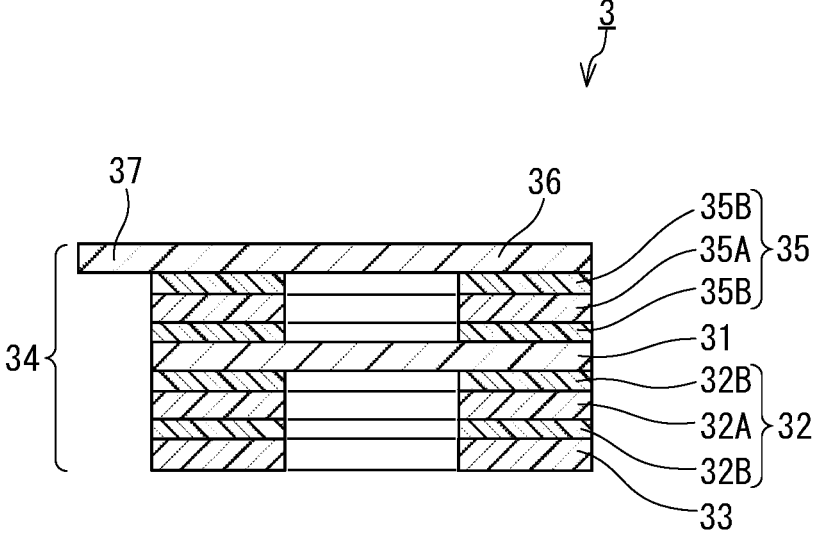
FIG. 12 is a cross-sectional view schematically showing an example of a protective cover member supplied using the member supplying sheet of the present invention.

FIG. 12 shows another example of the protective cover member 3 further including the cover film 36. The protective cover member 3 shown in FIG. 12 is the same as the protective cover member 3 shown in FIG. 11, except that the adhesive layer 32 and the adhesive layer 35 are double-sided adhesive tapes.

The protective cover member 3 shown in FIGS. 3A and 3B has a rectangular shape when viewed perpendicular to the principal surface of the protective membrane 31. It should be noted that the shape of the protective cover member 3 is not limited to the above example. The shape of the protective cover member 3 may be a polygon such as a square or rectangle, a circle, or an oval when viewed perpendicular to the principal surface of the protective membrane 31. The polygon may be a regular polygon. The polygon may have a rounded corner(s).

The area of the protective cover member 3 (the area when viewed perpendicular to the principal surface of the protective membrane 31) is, for example, 175 mm$^2$ or less. The protective cover member 3 having an area falling within the above range is suitable for placement on, for example, a circuit board or MEMS, which typically has an opening with a small diameter. The lower limit of the area of the protective cover member 3 is, for example, 0.20 mm$^2$ or more. The protective cover member 3 may have a larger area depending on the type of an object on which the protective cover member 3 is to be placed. The smaller the area of the protective cover member 3 is, the more difficult it becomes to pick up the protective cover member 3. Accordingly, the present invention brings about a particularly prominent effect when the area of the protective cover member 3 is in the above range.

The object 73 on which the protective cover member 3 is to be placed is, for example, a circuit board or a semiconductor device such as a MEMS. In other words, the protective cover member 3 may be a member for a semiconductor device, circuit board, or MEMS, intended for use in a semiconductor device, circuit board, or MEMS as the object 73. The MEMS may be a non-encapsulated device having a ventilation hole on a surface of its package. Examples of the non-encapsulated MEMS include various sensors for detecting the atmospheric pressure, humidity, a gas, air flow, or the like and electroacoustic transducer elements such as speakers and microphones. The object 73 is not limited to a completed semiconductor device or completed circuit board, and may be an intermediate product of the device or circuit board that is in the course of a production step. In this case, the protective cover member 3 can protect the intermediate product during the production step. Examples of the production step include a reflow soldering step, a dicing step, a bonding step, and a mounting step. It should be noted that the object 73 is not limited to the above examples.

The face 74 of the object 73 on which the protective cover member 3 can be placed is typically a surface of the object 73. The face 74 may be flat or curved. The opening 75 of the object 73 may be an opening of a recessed portion or an opening of a through hole.

The object 73 with the protective cover member 3 placed on the face 74 can be produced using the member supplying sheet 1. The present disclosure includes a method for producing an object provided with a protective cover member by supplying the member supplying sheet 1. The member supplying sheet 1 is typically supplied to a push-up pick-up apparatus.

The member supplying sheet 1 can be produced by arranging the protective cover members 3 on the surface 4 of the substrate sheet 2. The protective cover member 3 can be produced by, for example, laminating the protective membrane 31, the adhesive layer 32, and the carrier film 33 together. The substrate sheet 2 can be produced by, for example, laminating the substrate layer 21 and the adhesive layer 22 together. The member supplying sheet 1 can be produced by, for example, adhering the carrier film 33 to the substrate layer 21 via the adhesive layer 22.

The member supplying sheet 1 is supplied to an end user in the state of being packed with a packing material. The member supplying sheet 1 may include the adhesive layer 22 formed of a UV curable adhesive that has been cured by UV light irradiation, and may be packed with a packing material in the state where the protective cover members are arranged with intervals W of 0.05 mm or more and 5.0 mm or less between them.

EXAMPLES

The present invention will be described in more detail below with reference to Examples. The present invention is not limited to the following Examples.

First, methods for evaluating the properties of a substrate sheet, the pick-up performance of protective cover members on a member supplying sheet, and product misalignment will be described.

[Surface Free Energy]

The surface free energy of a carrier film included in a protective cover member was calculated from the surface tension $\gamma$ calculated in the above-described manner.

[Tack Force]

The tack force of an adhesive layer included in a substrate sheet was calculated in the above-described manner.

[Pick-Up Performance]

Figure 13A:
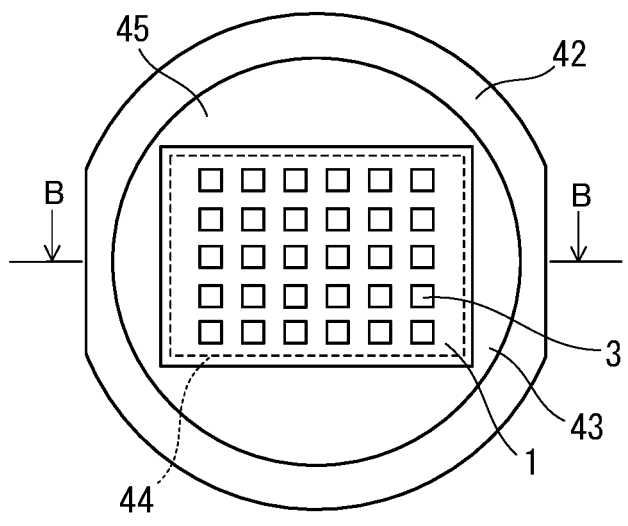
FIG. 13A is a schematic plan view illustrating an evaluation test performed in Examples to evaluate the pick-up performance of each member supplying sheet.
Figure 13B:
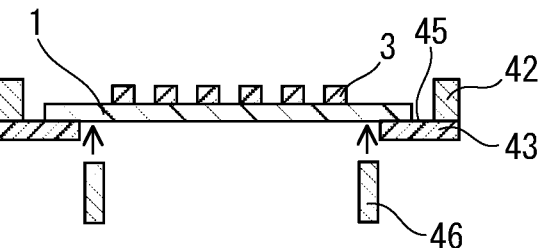
FIG. 13B is a cross-sectional view schematically showing a cross-section B-B taken from FIG. 13A.

The pick-up performance of a member supplying sheet were evaluated in the following manner. A member supplying sheet was fabricated and then placed on a mounter of a push-up pick-up apparatus (Daitron Co., Ltd., Wafer Chip Sorter WCS-700C). The mounter had four push-up indenters. The push-up indenters each had a needle-like shape with a diameter of 0.15 mm, a tip curvature of 0.022 mm, and a height of 0.20 mm. The mounter could push up each individual protective cover member on a substrate sheet by a given push-up amount and at a given push-up rate according to a program. The member supplying sheet was placed as described below using a dicing ring 42 (see FIGS. 13A and 13B. FIG. 13B shows a cross-section B-B taken from FIG. 13A). A single-sided adhesive sheet 43 was adhered to one surface of the dicing ring 42 with their outer peripheries aligned with each other. At a central portion of the single-sided adhesive sheet 43, an opening 44 having a rectangle shape (100 mm×60 mm) when viewed perpendicular to the principal surface of the sheet 43 was provided. Next, the member supplying sheet 1 as a target of evaluation was set on an adhesive surface of the single-sided adhesive sheet 43 so as to cover the opening 44, thereby fixing the member supplying sheet 1 to the dicing ring 42. The member supplying sheet 1 was set such that long sides of the member supplying sheet 1 and long sides of the opening 44 were parallel to each other and that the distance between the outer periphery of the member supplying sheet 1 and the outer periphery of the opening 44 was constant along the entire outer peripheries of both the member supplying sheet 1 and the opening 44. Then, the dicing ring 42 with the member supplying sheet 1 fixed thereto was placed on the mounter.

Figure 13C:
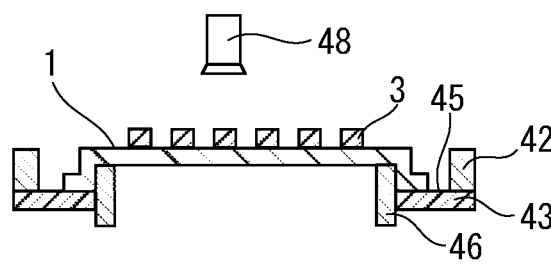
FIG. 13C is a cross-sectional view schematically illustrating the state at the time of pick-up.
Figure 14:
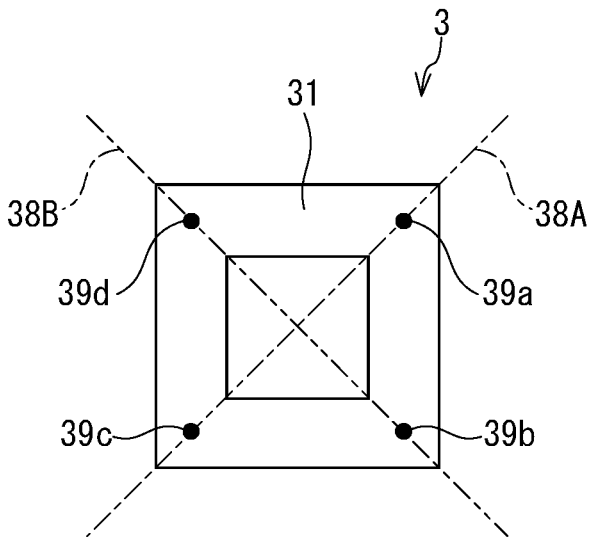
FIG. 14 is a schematic view illustrating the evaluation test performed in Examples to evaluate the pick-up performance of each member supplying sheet.

Next, ten protective cover members were randomly selected from 100 protective cover members arranged on one member supplying sheet and regarded as one set, and an attempt was made to pick up the protective cover members included in the set by pushing them up one by one in sequence. The push-up amount was set to 200 μm. The push-up rate was set to 4.0 mm/sec. The push-up was performed by pushing up the protective cover member 3 having a square shape at points 39*a*, 39*b*, 39*c*, and 39*d* by the above-described four push-up indenters. The points 39*a*, 39*b*, 39*c*, and 39*d* are each the center point between a vertex of the protective membrane 31 and the corresponding vertex of the substrate sheet 3 on either of two diagonal lines 38A and 38*b* passing through the opposite vertices of the protective membrane 31 and the opposite vertices of the substrate sheet 3 (see FIG. 14). The push-up was performed in the state where the single-sided adhesive sheet 43 and the member supplying sheet 1 were lifted up about 2.0 mm (expanding height: 2.0 mm) by another dicing ring (expanding ring) 46 whose outer diameter was smaller than the inner diameter of the dicing ring 42 having the member supplying sheet fixed thereto (see FIG. 13Ο; FIG. 13C schematically illustrates the state at the time of pick-up). As the dicing ring 46, one shaped so as not to overlap the protective cover member 3 when viewed perpendicular to the principal surface of the member supplying sheet 1 was selected. A suction nozzle 48 was used for pick-up, and a suction operation by the suction nozzle 48 was started at the moment when the push-up amount reached its maximum. The suction nozzle 48 had a diameter of 0.5 mm, and the suction pressure was set to 45 kPa. The suction time was set to 100 msec. The pick-up performance was evaluated based on the pick-up ratio B/A between the number A (ten) of protective cover members included in one set and the number B of successfully picked up protective cover members in the set. In the case where the pick-up ratio B/A was 9/10 or more, the pick-up performance was determined as acceptable (○), and in other cases, the pick-up performance was determined as unacceptable (x).

[Product Misalignment]

The product misalignment of a member supplying sheet was evaluated as follows. A member supplying sheet with ten protective cover members arranged thereon was subjected to a vibration test according to a method specified in JIS Z0232 using a combined environmental vibration tester (IMV Corporation, VS-5500-220T). The frequency range was set to 5 to 200 Hz, the vibration direction was set to the Z-axis (vertical) direction, the acceleration was set to 5.8 $m/s^2$, and the vibration time was set to 180 minutes. In the case where the protective cover members had displaced 0.10 mm or more in the horizontal direction with respect to the substrate sheet as compared to the initial state after the vibration test, the product misalignment was determined as unacceptable (x), and in the case where the displacement width in the horizontal direction was less than 0.10 mm, the product misalignment was determined as acceptable (○).

Production Example 1: Fabrication of Protective Cover Member A

As a protective membrane 31, a porous PTFE membrane (Nitto Denko Corporation, NTF1033, thickness: 10 μm) was prepared. The porous PTFE membrane had an external shape of a 3.0 mm×3.0 mm square. Next, a heat-resistant double-sided adhesive tape (Nitto Denko Corporation, No. 585) having a picture frame-like shape was adhered as an adhesive layer 32 to one principal surface of the protective membrane 31. The adhesive layer 32 had an external shape of a 3.0 mm×3.0 mm square and an internal shape of a 1.5 mm×1.5 mm square, and the width of the adhesive layer 32 was constant along the entire peripheries. Further, as a carrier film 33, a polyimide film (Du Pont-Toray Co Ltd., Kapton 200H, surface free energy: 53.3 mJ/m$^2$) was prepared so as to have the same shape as the heat-resistant double-sided adhesive tape. The protective membrane 31, the adhesive layer 32, and the carrier film 33 were adhered to each other with their outer peripheries aligned with each other. Adhesive layers 32B of the double-sided adhesive tape were both acrylic adhesive layers. Thus, a protective cover member A having a rectangular shape when viewed from the principal surface of the protective membrane 31 was obtained.

Production Example 2: Fabrication of Protective Cover Members B1 to B3

Protective cover members B1 to B3 were obtained in the same manner as in Production Example 1, except that three types of heat-resistant films were used as the carrier film 33, respectively. In the protective cover member B1, a vinylidene fluoride film (Kureha Extron Co., Ltd., KFC film FT-50Y, surface free energy: 34.1 mJ/m$^2$) was used as the carrier film 33. In the protective cover member B2, a polyethersulfone film (Sumitomo Bakelite Co., Ltd., SUMILIGHT FS-1300, surface free energy: 51.5 mJ/m$^2$) was used as the carrier film 33. In the protective cover member B3, a polyphenylene sulfide film (Toray Industries, Inc., TORELINA #50-3030, surface free energy: 64.5 mJ/m$^2$) was used as the carrier film 33.

Production Example 3: Fabrication of Protective Cover Member C

A protective cover member C was obtained in the same manner as in Production Example 1, except that a polytetrafluoroethylene film (Nitto Denko Corporation, NITOFLON No. 900UL, surface free energy: 18.0 mJ/m$^2$) was used as the carrier film 33.

(Substrate Sheet)

As substrate sheets 2, five types of dicing tapes a to e (Nitto Denko Corporation, ELEP HOLDER) were prepared. The product names and the properties of the dicing tapes a to e are shown in Table 2. The dicing tapes a to e each had a circular shape with a diameter of 270 mm.

TABLE 2

| Dicing tape | Product name | Thickness (mm) | Substrate | Adhesive layer |
|---|---|---|---|---|
| a | DU-2285KS | 0.085 | PO | UV curable PSA |
| b | DU-2385KS | 0.085 | PO | UV curable PSA |
| c | DU-300 | 0.085 | PO | UV curable PSA |
| d | WS-02T | 0.088 | PVC | UV curable PSA |
| e | V-15DR | 0.15 | PVC | PSA |

Example 1

The dicing tape a was adhered to a dicing ring (Izumi Metal Corporation, 8-inch flat ring) such that an adhesive layer 22 of the dicing tape was on top. Next, 100 protective cover members A were arranged (in 10 columns×10 rows) on and adhered to the adhesive layer 22 of the dicing tape a. The protective cover members A were arranged with intervals W of 0.10 mm or more and 0.50 mm or less between them when viewed perpendicular to the arrangement surface of the dicing tape a on which the protective cover members A were arranged. One hour after the above-described adhesion, a PET substrate as a separator was placed over the protective cover members A, and then, using a UV irradiation device (Nitto Seiki, UM810), the protective cover members A were irradiated with UV light for 7 seconds from the substrate layer 21 side of the dicing tape a to achieve an accumulated amount of light of 300 mJ/cm$^2$. Thus, a member supplying sheet of Example 1 was obtained.

Figure 17:
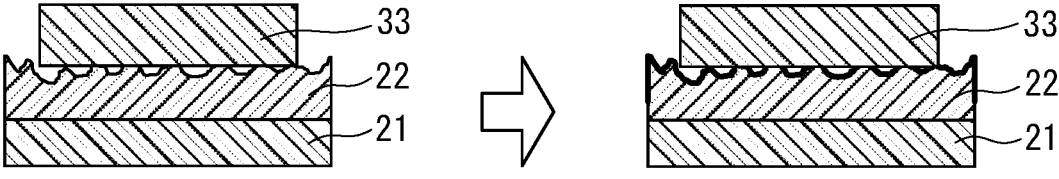
FIG. 17 schematically illustrates some of the production steps used to produce each member supplying sheet in Examples.

FIG. 17 schematically illustrates some of the production steps of the member supplying sheet 1. In FIG. 17, the protective membrane 31 and the adhesive layer 32 included in the protective covering member 3 are omitted for the sake of simplicity of illustration. By adhering the carrier film 33 to the substrate layer 21 via the UV curable adhesive forming the adhesive layer 22 (see the drawing on the left in FIG. 17) and then irradiating the resulting laminate with UV light under the above-described conditions, the adhesive forming the adhesive layer 22 is cured and shrunk, whereby the fluidity of the adhesive is reduced (see the diagram on the right in FIG. 17). That is, the member supplying sheet 1 has the adhesive layer 22, which is a UV curable adhesive that has been cured by UV light irradiation. Accordingly, even in the case where the affinity between the carrier film 33 and the adhesive is high, an increase in tack force of the adhesive over time is suppressed.

Example 2

A member supplying sheet of Example 2 was obtained in the same manner as in Example 1, except that the dicing tape b was used as the substrate sheet 2.

Example 3

A member supplying sheet of Example 3 was obtained in the same manner as in Example 1, except that the dicing tape c was used as the substrate sheet 2.

Example 4

A member supplying sheet of Example 4 was obtained in the same manner as in Example 1, except that the dicing tape d was used as the substrate sheet 2.

Example 5

A member supplying sheet of Example 5 was obtained in the same manner as in Example 1, except that the protective cover members B1 were used instead of the protective cover members A.

Example 6

A member supplying sheet of Example 6 was obtained in the same manner as in Example 1, except that the protective cover members B2 were used instead of the protective cover members A.

Example 7

A member supplying sheet of Example 7 was obtained in the same manner as in Example 1, except that the protective cover members B3 were used instead of the protective cover members A.

Comparative Example 1

A member supplying sheet of Comparative Example 1 was obtained in the same manner as in Example 1, except that, after the adhesion, the resulting laminate was stored at 85° C. and 95% RH for 24 hours and then irradiated with UV light under the above-described conditions.

Comparative Example 2

A member supplying sheet of Comparative Example 2 was obtained in the same manner as in Example 2, except that, after the adhesion, the resulting laminate was stored at 85° C. and 95% RH for 24 hours and then irradiated with UV light under the above-described conditions.

Comparative Example 3

A member supplying sheet of Comparative Example 3 was obtained in the same manner as in Example 3, except that, after the adhesion, the resulting laminate was stored at 85° C. and 95% RH for 24 hours and then irradiated with UV light under the above-described conditions.

Comparative Example 4

A member supplying sheet of Comparative Example 4 was obtained in the same manner as in Example 4, except that, after the adhesion, the resulting laminate was stored at 85° C. and 95% RH for 24 hours and then irradiated with UV light under the above-described conditions.

Comparative Example 5

A member supplying sheet of Comparative Example 5 was obtained in the same manner as in Comparative Example 1, except that the dicing tape e was used as the substrate sheet 2.

Comparative Example 6

A member supplying sheet of Comparative Example 6 was obtained in the same manner as in Example 1, except that the protective cover members C was used instead of the protective cover members A.

The results of evaluations are shown in Tables 3A and 3B below.

TABLE 3A

| | Dicing tape | Carrier film | Carrier film $\gamma$ (mN/m) | Tack force before UV light irradiation (mN/mm$^2$) | UV light irradiation | Pick-up performance (B/A) | Tack force after UV light irradiation (mN/mm$^2$) | Product misalignment |
|---|---|---|---|---|---|---|---|---|
| Ex. 1 | a | PI | 53.3 | 114 | 1 hr after adhesion | o (10/10) | 61 | o |
| Ex. 2 | b | PI | 53.3 | 179 | 1 hr after adhesion | o (10/10) | 82 | o |
| Ex. 3 | c | PI | 53.3 | 194 | 1 hr after adhesion | o (10/10) | 51 | o |
| Ex. 4 | d | PI | 53.3 | 113 | 1 hr after adhesion | o (10/10) | 47 | o |
| Ex. 5 | a | PVdF | 34.1 | 114 | 1 hr after adhesion | o (10/10) | 61 | o |
| Ex. 6 | a | PES | 51.5 | 114 | 1 hr after adhesion | o (10/10) | 61 | o |
| Ex. 7 | a | PPS | 64.5 | 114 | 1 hr after adhesion | o (10/10) | 61 | o |

TABLE 3B

| | Dicing tape | Carrier film | Carrier film $\gamma$ (mN/m) | Tack force before UV light irradiation (mN/mm$^2$) | UV light irradiation | Pick-up performance (B/A) | Tack force after UV light irradiation (mN/mm$^2$) | Product misalignment |
|---|---|---|---|---|---|---|---|---|
| Comp. Ex. 1 | a | PI | 53.3 | 114 | 24 hr after adhesion (85° C., 95% RH) | x (2/10) | 113 | o |
| Comp. Ex. 2 | b | PI | 53.3 | 179 | 24 hr after adhesion (85° C., 95% RH) | x (1/10) | 180 | o |

TABLE 3B-continued

|  | Dicing tape | Carrier film | Carrier film γ (mN/m) | Tack force before UV light irradiation (mN/mm²) | UV light irradiation | Pick-up performance (B/A) | Tack force after UV light irradiation (mN/mm²) | Product misalignment |
|---|---|---|---|---|---|---|---|---|
| Comp. Ex. 3 | c | PI | 53.3 | 194 | 24 hr after adhesion (85° C., 95% RH) | x (0/10) | 110 | o |
| Comp. Ex. 4 | d | PI | 53.3 | 113 | 24 hr after adhesion (85° C., 95% RH) | x (3/10) | 113 | o |
| Comp. Ex. 5 | e | PI | 53.3 | 149 (No change as the resin was not UV curable) | 24 hr after adhesion (85° C., 95% RH) | x (4/10) | 149 | o |
| Comp. Ex. 6 | a | PTFE | 18.9 | 114 | 1 hr after adhesion | o (10/10) | 61 | x |

As shown in Tables 3A and 3B, in Examples 1 to 7, good pick-up performance could be achieved and product misalignment did not occur.

Next, the pick-up performance of the member supplying sheets of Examples 1 to 3 were evaluated by, 3 hours after the adhesion, irradiating them with UV light under the above-described conditions. In Example 1, the pick-up ratio B/A was 10/10, and excellent pick-up performance was maintained. The pick-up ratios B/A in Examples 2 and 3 were both 9/10. These results indicate that the smaller the (initial) tack force before the UV light irradiation, the greater the improvement in the pick-up performance. That is, it is considered that the (initial) tack force before UV light irradiation affects the tack force after the UV light irradiation. The mechanism thereof is presumed as follows, although the details of the mechanism have not been clarified. If the tack force before UV light irradiation is large, a sufficient decrease in tack force may not be achieved even after the UV light irradiation. In this case, the adhesive force after the UV light irradiation is also large, and it is considered that this deteriorates the pick-up performance. Also, the higher the degree of curing and shrinkage of the adhesive layer 22 at the time of UV light irradiation, the smaller the contact area between the carrier film 33 as the adherend and the adhesive layer 22 and the lower the adhesive force. Accordingly, curing and shrinkage of the adhesive layer 22 during UV light irradiation are suppressed if the tack force before the UV light irradiation is large, whereby the adhesion area between the carrier film 33 and the adhesive layer 22 is less likely to be reduced. In this case, a decrease in adhesive force caused by UV light irradiation is suppressed, and it is considered that this deteriorates the pick-up performance.

The tack force and the adhesive force of a member supplying sheet before UV light irradiation can be estimated from the member supplying sheet after the UV light irradiation using qualitative and quantitative analyses on a UV curable adhesive forming an adhesive layer 22 (the type of monomer and the amount of each component) and information on the substrate composition.

INDUSTRIAL APPLICABILITY

The member supplying sheet of the present invention can be used for, for example, supplying protective cover members to a push-up pick-up apparatus.

The invention claimed is:

1. A member supplying sheet for supplying protective cover members, the member supplying sheet comprising:
   two or more protective cover members each configured to be placed on a face of an object that has an opening on the face; and
   a substrate sheet with the two or more protective cover members arranged on a surface thereof, wherein
   the protective cover members each include a laminate including: a protective membrane shaped to cover the opening when the protective cover member is placed on the face; and a carrier film joined to a peripheral portion of the protective membrane,
   the substrate sheet includes a substrate layer and an adhesive layer laminated on the substrate layer,
   the carrier film is adhered to the substrate layer via the adhesive layer,
   a surface free energy of the carrier film on a surface thereof on a side closer to the substrate sheet is 20 mJ/m² or more, and
   the adhesive layer has a tack force of 100 mN/mm² or less.

2. The member supplying sheet according to claim 1, wherein the tack force is 20 mN/mm² or more.

3. The member supplying sheet according to claim 1, wherein, on the surface of the substrate sheet, the two or more protective cover members are arranged with an interval of 0.05 mm or more and 5.0 mm or less between protective cover members.

4. The member supplying sheet according to claim 1, wherein the adhesive layer is an ultraviolet curable adhesive that has been cured by ultraviolet light irradiation.

5. The member supplying sheet according to claim 1, wherein the protective membrane has air permeability in its thickness direction.

6. The member supplying sheet according to claim 1, wherein the protective membrane includes a polytetrafluoroethylene membrane.

7. The member supplying sheet according to claim 1, wherein the carrier film includes at least one selected from the group consisting of polyimides, polyvinylidene fluoride, polyethersulfone, and polyphenylene sulfide.

8. The member supplying sheet according to claim 1, wherein the laminate further includes a cover film that is on a side opposite to the carrier film with respect to the protective membrane and covers the protective membrane.

9. The member supplying sheet according to claim 1, wherein the protective cover members are members for a micro electro mechanical system (MEMS) as the object.

\* \* \* \* \*